United States Patent [19]
Gabrisko, Jr. et al.

[11] Patent Number: 6,007,351
[45] Date of Patent: Dec. 28, 1999

[54] BUSSPLATE

[75] Inventors: Ronald E. Gabrisko, Jr., Warren, Ohio; Phillip D. Winters, Kokomo, Ind.; Larry B. Walters, Warren, Ohio

[73] Assignee: Packard Hughes Interconnect Company, Irvine, Calif.

[21] Appl. No.: 09/121,372

[22] Filed: Jul. 23, 1998

[51] Int. Cl.⁶ .................................................. H01R 13/52
[52] U.S. Cl. ............................................. 439/76.2; 439/92
[58] Field of Search ........................... 439/92, 76.1, 76.2, 439/620, 607, 95, 108, 608, 609, 610, 74, 75, 493, 213; 361/627, 736, 360, 412; 174/52.1

[56] References Cited

U.S. PATENT DOCUMENTS

| | | |
|---|---|---|
| 4,208,080 | 6/1980 | Teagno ..................................... 439/76.2 |
| 4,959,018 | 9/1990 | Yamamoto et al. ....................... 439/76 |
| 5,023,752 | 6/1991 | Detter et al. ............................. 361/399 |
| 5,373,104 | 12/1994 | Brauer ..................................... 174/52.1 |
| 5,462,444 | 10/1995 | Korsunsky et al. ..................... 439/108 |
| 5,742,005 | 4/1998 | Saka et al. .............................. 174/52.1 |
| 5,744,751 | 4/1998 | Kasai ...................................... 174/52.1 |
| 5,808,859 | 9/1998 | Liang ...................................... 361/673 |
| 5,817,976 | 10/1998 | Yanase et al. .......................... 174/52.1 |
| 5,831,814 | 11/1998 | Hamill .................................... 361/627 |
| 5,895,293 | 4/1999 | Brandberg ............................... 439/620 |

Primary Examiner—Paula Bradley
Assistant Examiner—Alexander Gilman
Attorney, Agent, or Firm—Patrick M. Griffin

[57] ABSTRACT

A bussplate for an electronic device includes a plate having a plurality of integral electrical ground interfaces for commonizing electrical ground current within the electronic device. The plate grounds filter inserts that filter the electronic device from electronic noise and shields the electronic device from electromagnetic interference.

10 Claims, 4 Drawing Sheets

6,007,351

BUSSPLATE

TECHNICAL FIELD

The present invention relates generally to electrical busses, and, more particularly, to a bussplate for an electronic controller in a motor vehicle.

BACKGROUND OF THE INVENTION

Motor vehicles, and in particular an automotive vehicle, frequently incorporate electronic components, such as an electronic controller, to functionally communicate with various systems in the automotive vehicle. For example, an engine controller functionally communicates with the engine and engine-related systems, while a vehicle body controller functionally communicates with vehicle body-related systems. Motor vehicles also contain other well known electronic components, such as a radio, or a compact disc player, or a cellular phone. With the proliferation of electronic components in a motor vehicle, there is an increased potential for electronic noise or electromagnetic interference from one electronic component to another. One potential path for electrical noise or electromagnetic interference in an electronic controller is through a connector that functionally connects the electronic controller with another component.

Filters and shields are frequently utilized to reduce or eliminate unwanted electrical signals and electromagnetic interference. In one such case, a filtered electrical connector having a die cast aluminum housing is mounted to a printed circuit board, for attaching a wiring harness to the printed circuit board. The die cast housing includes a plurality of compartments, with a filter insert contained within each compartment, for filtering electronic noise. While the filter insert works well, it does not completely shield an opening in the housing for an electrical connector.

As is known in the art, a bussplate is used to commonize electrical current in electrical circuits. It is also known in the art that all electrical circuits must be grounded to a common ground. In an electronic controller, multiple unique internal and external ground interfaces are typically utilized to ground individual components including the connector, filter insert, printed circuit board or housing. For example, a pin may be cast in the housing to ground the filter insert to the housing. A grounding clip may be used to ground the printed circuit board to the metal housing. An external ground, such as a cable, connector may ground the housing to a massive conductive structure, such as the engine. These grounding methods require that the housing must be made of a conductive metal material. In an underhood environment, a housing made from a material, such as a die cast aluminum, may be subject to corrosion. Thus, there is a need in the art for a bussplate that integrates multiple ground interfaces, while providing filtering and shielding from electrical noise and electromagnetic interference within a non-corrosive enclosure.

SUMMARY OF THE INVENTION

Accordingly, the present invention includes a bussplate. The bussplate includes a plate having a plurality of integral electrical ground interfaces for commonizing electrical ground current within the electronic device. The plate grounds filter inserts that filter the electronic device from electronic noise and shields the electronic device from electromagnetic interference.

One advantage of the present invention is that a bussplate for an electronic controller is provided that integrates multiple ground interfaces. Another advantage of the present invention is that the bussplate shields the electronic controller from unwanted noise or other electrical interference. Still another advantage of the present invention is that the housing for the electrical controller can be made from a non-corrosive material, such as plastic.

Other features and advantages of the present invention will be readily appreciated as the same becomes better understood after reading the subsequent description when considered in connection with the accompanying drawings.

DETAILED DESCRIPTION OF THE PRESENTLY PREFERRED EMBODIMENT

Figure 1:
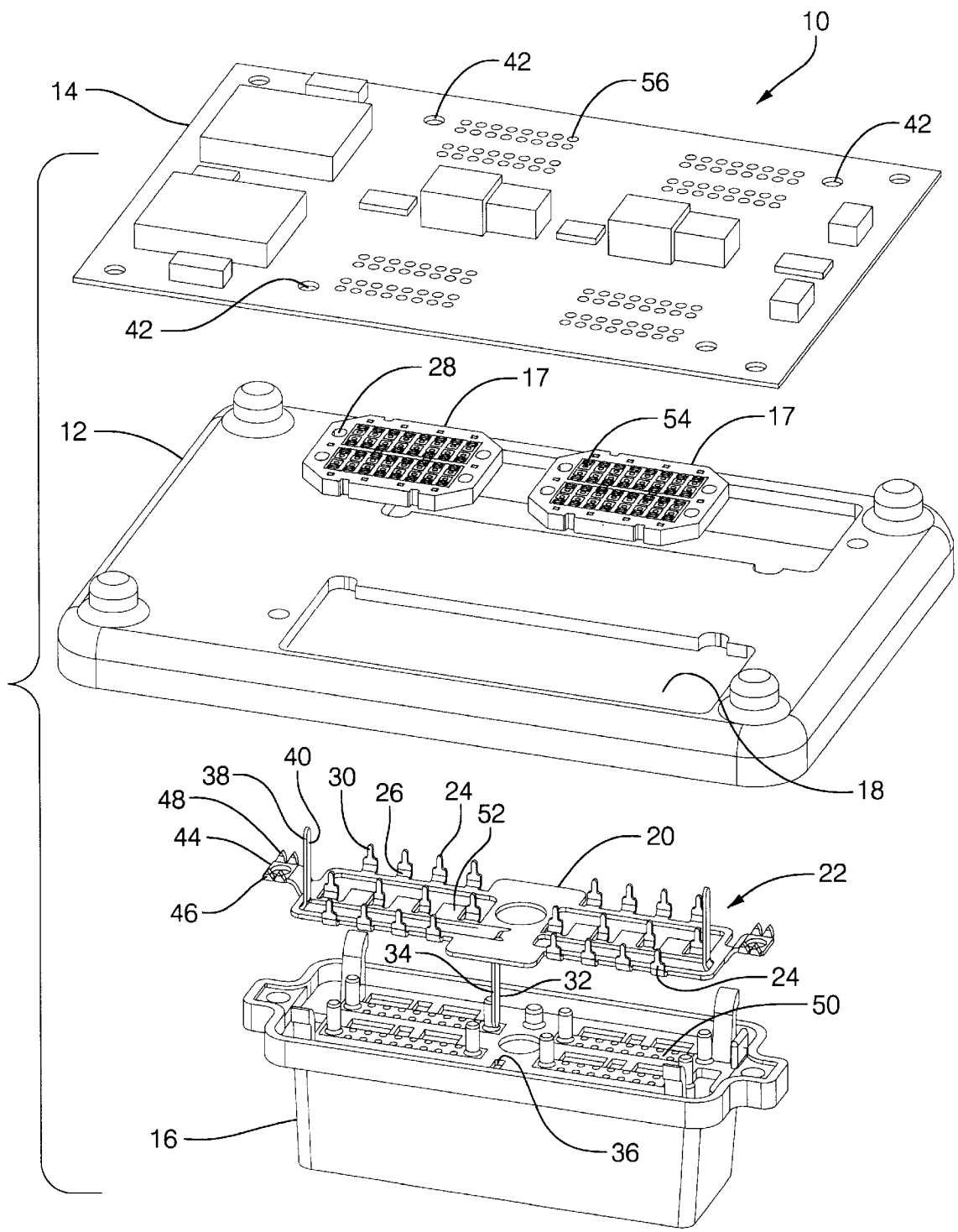
FIG. 1 is an exploded view of an electronic controller illustrating features of the present invention.
Figure 2:
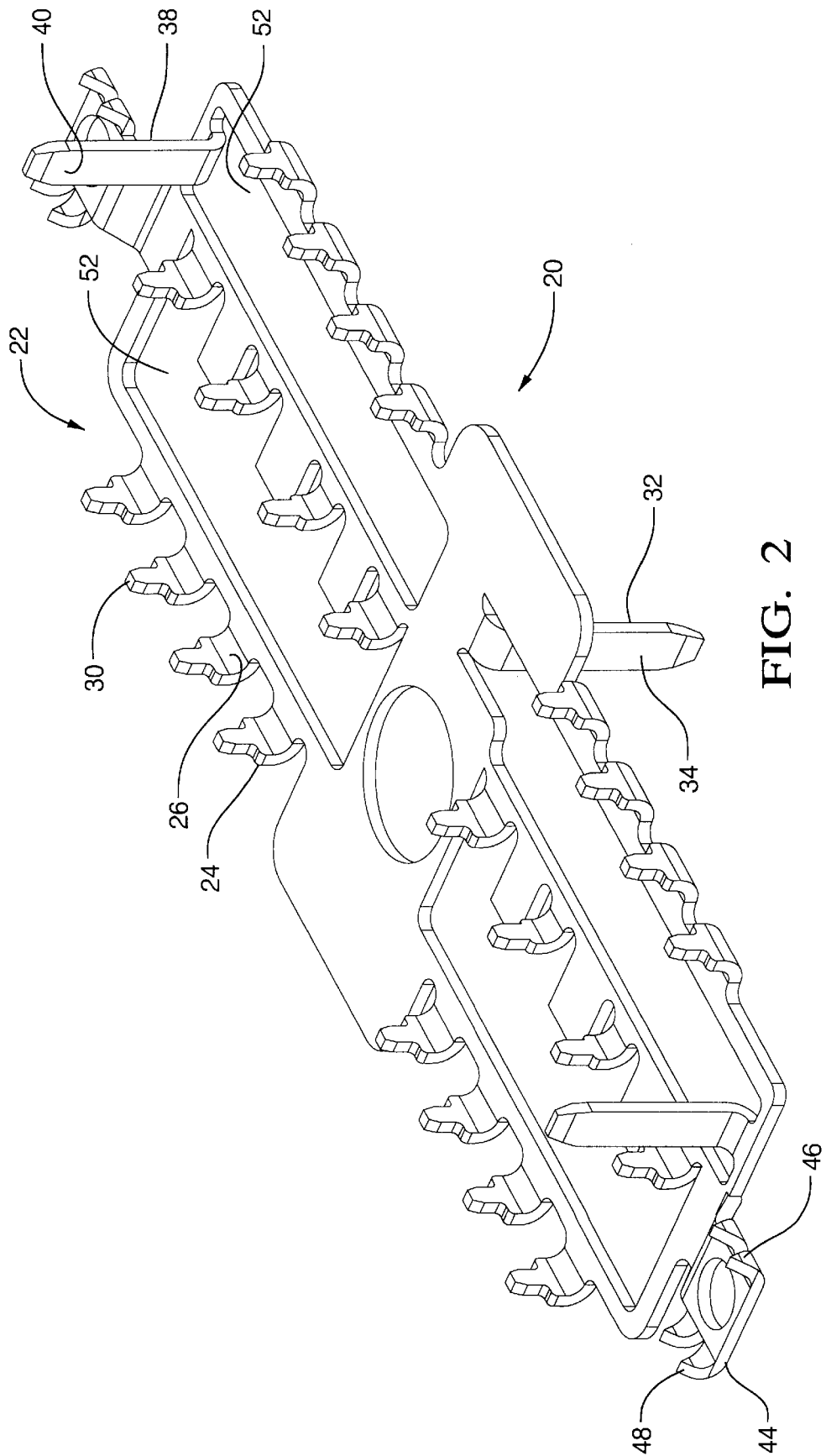
FIG. 2 is a perspective view of a bussplate, according to the present invention, of the electronic controller of FIG. 1.

Referring to FIGS. 1 and 2, one embodiment of an electronic controller is illustrated. It should be appreciated that, in this example, the electronic controller 10 is an engine controller on a motor vehicle (not shown), and in particular an automotive vehicle. The electronic controller 10 includes a housing 12 and a cover (not shown) attached to the housing 12. Preferably, the housing 12 has a generally rectangular, planar shape and is made of a metal material such as aluminum. Advantageously, the housing 12 can be made from a deep drawn aluminum material instead of die cast aluminum. The electronic controller 10 also includes a printed circuit board 14, as is known in the art, disposed on the housing 12. The electronic controller 10 also includes an electrical connector 16, such as a filtered electrical connector, mounted to the housing 12, for attaching a wiring harness (not shown) to the printed circuit board 14, for electrically communicating between the printed circuit board 14 and another component (not shown) in the automotive vehicle. In this example, the electrical connector 16 includes a filter insert 17 disposed between the electrical connector 16 and the printed circuit board 14. The filter insert 17, as is well understood in the art, is a secondary component used to filter electronic noise in an electrical circuit. For example, the filter insert 17 filters unwanted electrical noise from passing through the connector 16 to the printed circuit board 14.

The housing 12 includes at least one aperture 18 for receiving a bussplate 20, according to the present invention. The bussplate 20 is a stamped, conductive, metal plate having a plurality of ground interfaces 22 for grounding the electronic controller 10 to a common ground (not shown) in the automotive vehicle. It should be appreciated that in this example, the common ground is an engine ground. Advantageously, in this example, the bussplate 20 serves as a filter for the electrical connector 16, and a shield for the opening 18 for receiving the bussplate 20 in the housing 12. Preferably, the bussplate 20 is a plated metal, such as tin plated over brass.

The ground interfaces 22 includes a first ground interface 24, which electrically grounds the filter insert 17 disposed on the first ground interface 24, to the bussplate 20. In this example, the first ground interface 24 includes a plurality of blades 26 extending radially from the bussplate 20. The blades 26 are press fit into openings 28 in the filter insert 17. The blades 26 are generally rectangular in shape. Preferably, the outermost end of the blade 30 is slightly narrower than the other end. It should also be appreciated that, in this example, the first ground interface 24 includes three parallel rows having four blades 26 each.

The ground interfaces 22 also includes a second ground interface 32, that electrically grounds the bussplate 20 to the engine ground of this example. Preferably, the second ground interface 32 is a blade 34 extending radially from the bussplate 20 into an aperture in the electrical connector 16. The blade 34 is electrically grounded to a ground in the wiring harness (not shown), which in turn is electrically connected to the engine ground.

The ground interfaces 22 also include a third ground interface 38. The third ground interface 38 is a radially extending blade 40 of sufficient length to pass through an opening 42 in the printed circuit board 14. Preferably, the blade 40 is soldered to the printed circuit board 14 to electrically ground the printed circuit board 14 to the bussplate 20. It should be appreciated that, in this example, the third ground interface 38 includes two blades 38, each having a rectangular shape, that is slightly tapered.

The ground interfaces 22 further include a fourth ground interface 44 to electrically ground the housing 12 to the bussplate 20. The fourth ground interface 44 is a blade 46 extending radially from the bussplate 20. In this example, the fourth ground interface 44 includes four pairs of blades 46. Preferably, a tip 48 of the blade 46 tapers to a point so that the blades 46 bite into the housing 12 when the electronic controller 10 is assembled, to complete the electrical connection.

To assemble the electronic controller 10, the electrical connector 16 is attached to the housing 12, such as with screws (not shown). A plurality of pins (not shown) are inserted into openings 50 in the electrical connector 16, and the bussplate 20 is disposed on the housing 12, such that the pins pass through corresponding openings 52 in the bussplate 20. The blades 46 from the bussplate 20 bite into the housing 12 to ground the bussplate 20 to the housing 12. The filter insert 17 is positioned over the bussplate 20, such that the blades 26 fit into corresponding openings 28 in the filter insert 17 and the pins pass through their corresponding openings 54 in the filter insert 17. The printed circuit board 14 is then positioned over the bussplate 20, such that the pins pass through corresponding openings 56 in the printed circuit board 14, and the blade 40 extends through its corresponding opening 42 in the printed circuit board 14. The blade 40 is soldered to the printed circuit board 14 to complete the electrical connection.

Figure 3:
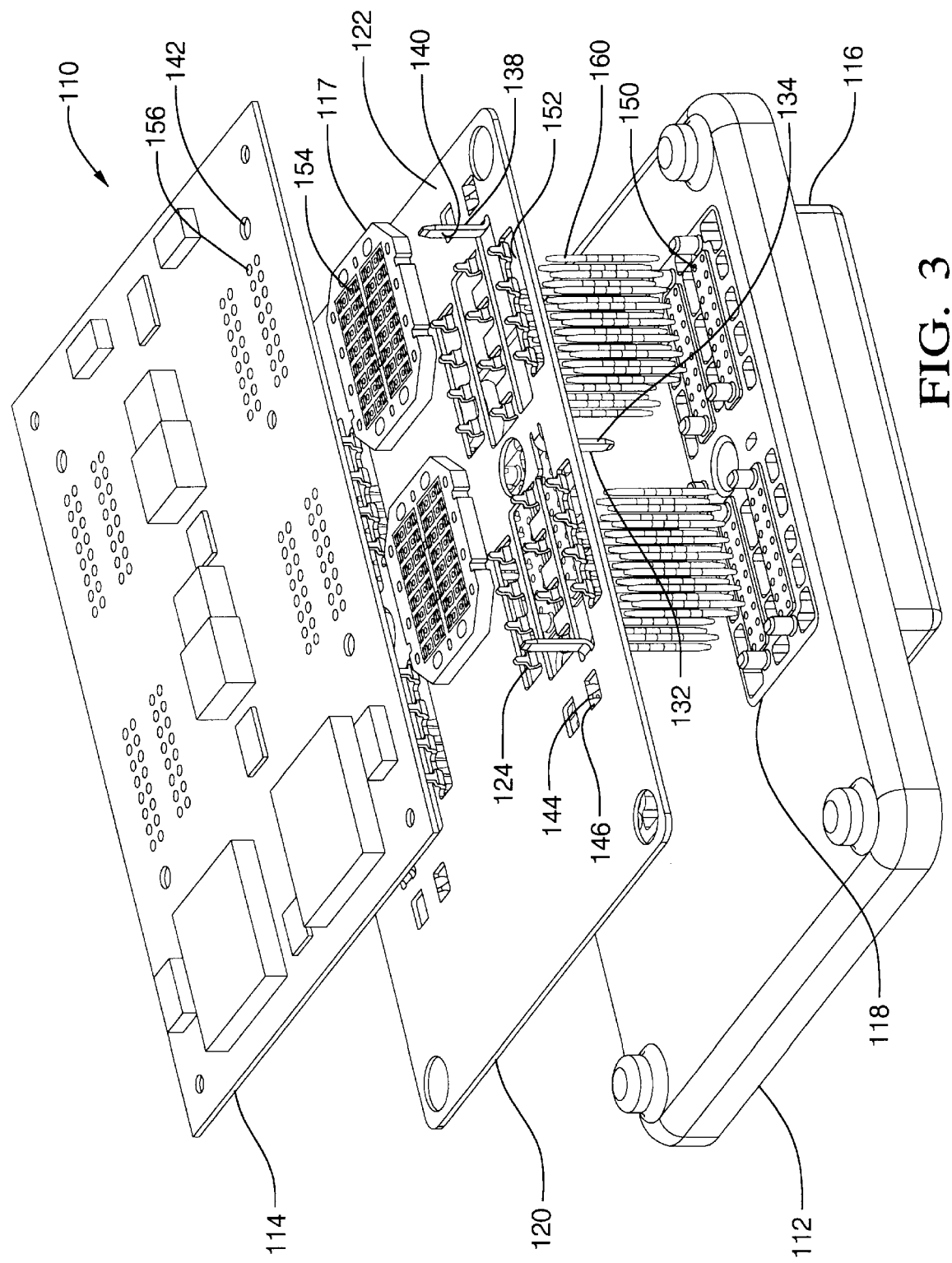
FIG. 3 is an exploded view of an electronic controller illustrating another embodiment of the bussplate, according to the present invention.
Figure 4:
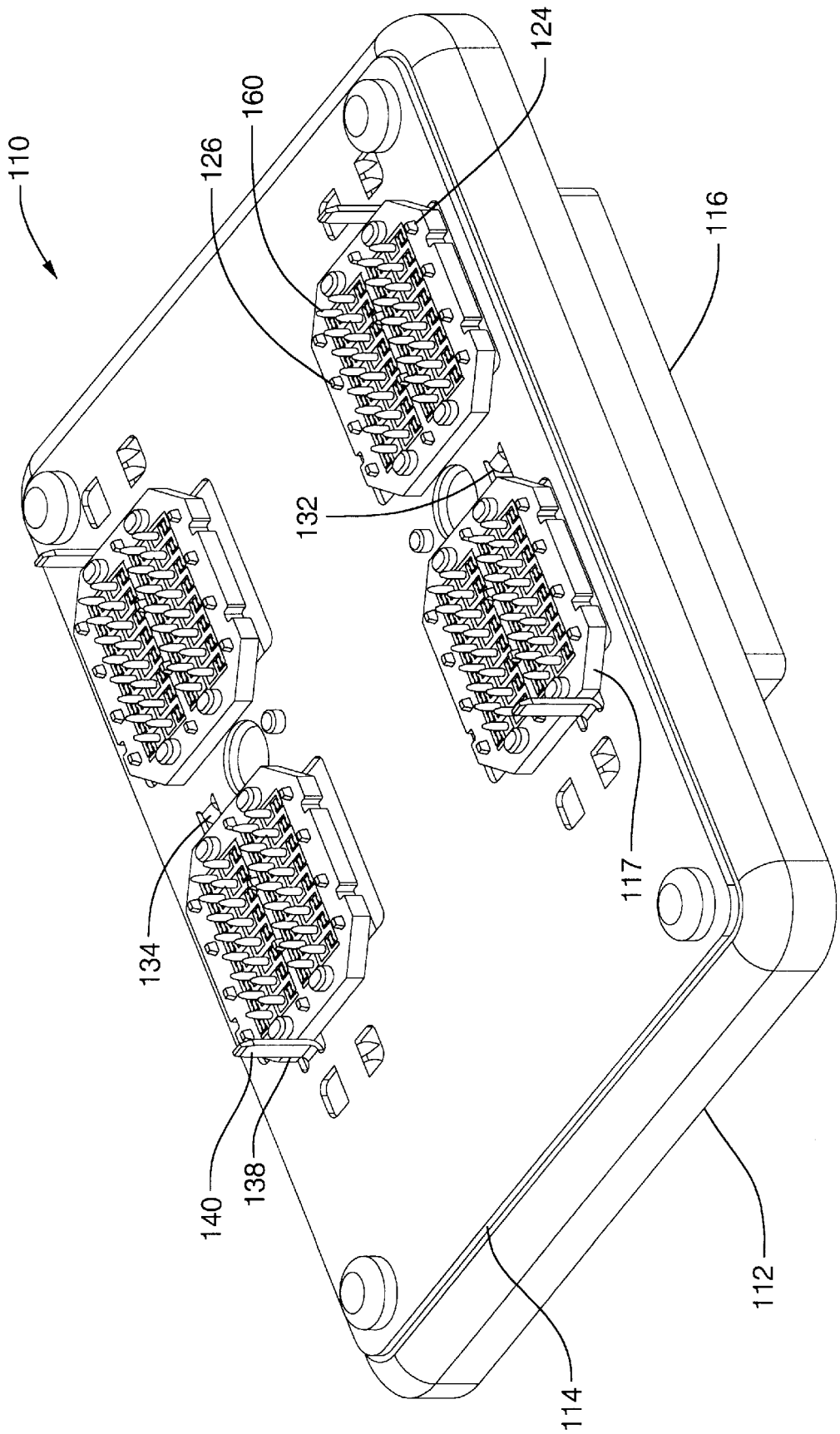
FIG. 4 is an assembled perspective view of the electronic controller of FIG. 3.

Referring to FIG. 3 and 4, another embodiment, according to the present invention, of the bussplate 20 for the electronic controller 10 is illustrated. It should be appreciated that like parts of the electronic controller 10 have like reference numerals increased by one hundred (100). A cover (not shown) is mounted to the housing 112 to enclose the electronic controller 110. In this embodiment, the housing 112 is generally planar, and made from a corrosion-resistant material, such as plastic. Advantageously, a plastic housing 112 resists corrosion in the harsh underhood environment of the automotive vehicle. The housing 112 includes the aperture 118 for receiving the electrical connector 116, which in this example, is a filtered electrical connector. The filtered electrical connector 116 electrically connects a wiring harness (not shown) with the printed circuit board 114 and another component (not shown) in the automotive vehicle. The filter insert 117 is disposed between the filtered electrical connector 116 and the printed circuit board 114 to prevent electrical noise from disturbing the printed circuit board 114. The electrical connector 116 is electrically connected to the printed circuit board 114 through a plurality of pins 160 extending through corresponding openings 150, 154,156 in the filtered electrical connector 116, the filter insert 117, and the print circuit board 114, wherein the pins 160 are soldered to the printed circuit board 114.

The electronic controller 110 includes the bussplate 120 having a plurality of ground interfaces 122 disposed between the housing 112 and the printed circuit board 114. The bussplate 120 is a stamped metal plate, generally corresponding in size and shape to that of the housing 112. Advantageously, the bussplate 120 is of sufficient size to provide shielding of the printed circuit board 114 from electromagnetic interference. The plurality of ground interfaces 122 includes the first ground interface 124 to electrically ground the filter insert 117 to the bussplate 120, the second ground interface 132 to electrically ground the bussplate 120 to a common ground (not shown), and the third ground interface 138 to electrically ground the printed circuit board 114 to the bussplate 120. Advantageously, in this embodiment the fourth ground interface is eliminated since the housing is made from a plastic material. In this example, the first ground interface 124 is the first ground interface blade 126, the second ground interface is the second ground interface blade 134 and the third ground interface 138 is the third ground interface blade 140. The assembly of the electronic controller 110 and bussplate 120 is similar to that of the electronic controller 10 and bussplate 20.

The present invention has been described in an illustrative manner. It is to be understood that the terminology which has been used is intended to be in the nature of words of description rather than of limitation.

Many modifications and variations of the present invention are possible in light of the above teachings. Therefore, within the scope of the appended claims, the present invention may be practiced other than as specifically described.

We claim:

1. An electronic controller comprising:
    a housing having at least one aperture;
    a printed circuit board mounted to said housing;
    an electrical connector mounted to said housing;
    a filter insert disposed between said electrical connector and said printed circuit board; and
    a bussplate disposed in said at least one aperture and having a plurality of different types of ground interfaces for electrically contacting and grounding said filter insert and said printed circuit board and said electrical connector to a common electrical ground.

2. An electronic controller as set forth in claim 1 wherein said bussplate is a stamped metal plate.

3. An electronic controller as set forth in claim 1 wherein said housing is generally planar.

4. An electronic controller as set forth in claim 1 wherein said housing is made of a corrosion-resistant material.

5. An electronic controller as set forth in claim 4 wherein said corrosion-resistant material is plastic.

6. An electronic controller as set forth in claim 1 wherein said ground interfaces include at least one first ground interface blade extending perpendicularly from said bussplate for electrically grounding said filter insert.

7. An electronic controller as set forth in claim 6 wherein said ground interfaces include at least one second ground interface blade extending perpendicularly from said bussplate and through said electrical connector for electrically grounding said electrical connector.

8. An electronic controller as set forth in claim 7 wherein said ground interfaces include at least one third ground interface blade extending perpendicularly from said bussplate for electrically grounding said printed circuit board.

9. An electronic controller as set forth in claim 8 wherein said ground interfaces include at least one fourth ground interface blade extending perpendicularly from said bussplate for electrically grounding said housing.

10. An electronic controller as set forth in claim 9 wherein said bussplate has a planar portion and said ground interfaces extending perpendicularly from said planar portion.

\* \* \* \* \*